United States Patent
Nakayama et al.

(10) Patent No.: US 6,456,160 B1
(45) Date of Patent: Sep. 24, 2002

(54) FEEDFORWARD AMPLIFIER

(75) Inventors: Masatoshi Nakayama, Tokyo (JP);
Kenichi Horiguchi, Tokyo (JP); Yuji Sakai, Tokyo (JP); Yukio Ikeda, Tokyo (JP); Junichi Nagano, Tokyo (JP); Haruyasu Senda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 40 days.

(21) Appl. No.: 09/840,181

(22) Filed: Apr. 24, 2001

Related U.S. Application Data

(63) Continuation of application No. PCT/JP00/02202, filed on Apr. 5, 2000.

(30) Foreign Application Priority Data

Sep. 1, 1999 (JP) ............................................. 11-247458

(51) Int. Cl.[7] .............................................. H03F 3/66
(52) U.S. Cl. ........................................ 330/52; 330/151
(58) Field of Search .......................... 330/52, 149, 151, 330/136

(56) References Cited

U.S. PATENT DOCUMENTS 5,023,565 A  6/1991  Lieu ........................... 330/151
5,912,586 A * 6/1999  Mitzlaff .................. 330/151 X

FOREIGN PATENT DOCUMENTS

| JP | A777330 | 8/1995 |
| JP | A7336153 | 12/1995 |
| JP | A11177351 | 7/1999 |
| WO | A1-9744894 | 11/1997 |

* cited by examiner

*Primary Examiner*—Steven J. Mottola

(57) ABSTRACT

A feedforward amplifier combines an input signal delayed by a delay circuit with an output signal by a combiner; down-converts the output of the combiner to a low frequency by a frequency converter; extracts a distortion component from the output of the frequency converter; measures the distortion component by a power detector; and controls a second vector regulator of a distortion canceling loop by a controller such that the distortion component measured becomes minimum.

8 Claims, 12 Drawing Sheets

FEEDFORWARD AMPLIFIER

CROSS-REFERENCE TO THE RELATED APPLICATION

This application is a continuation of International Application No. PCT/JP00/02202, whose international filing date is Apr. 5, 2000, the disclosures of which Application are incorporated by reference herein.

BACKGROUND OF THE INVENTION

1. Field of the Invention

The present invention relates to a feedforward amplifier for carrying out low distortion amplification in a radio frequency band.

2. Description of Related Art

A feedforward amplifier that achieves a low distortion characteristic by feedforward distortion compensation is often used as an amplifier for carrying out low distortion amplification in a radio frequency band such as VHF, UHF and microwave frequency bands. The feedforward distortion compensation can implement favorable distortion compensation in principle, and has an advantage of being able to configure a very low distortion, small amplifier. However, it has a problem in that when the characteristic of the amplifier varies because of ambient temperature or deterioration with age, its distortion compensation range is reduced and the distortion characteristic is impaired significantly.

To solve the problem, a method is proposed that injects a pilot signal into a loop constituting the feedforward distortion compensation system, and controls the amplifier or the loop constituting the feedforward system by detecting the pilot signal.

FIG. 1 is a block diagram showing a configuration of a feedforward amplifier disclosed in Japanese patent application publication No. 7-77330. The technique is an example that injects the pilot signal into the feedforward distortion compensation system to control the feedforward system.

In FIG. 1, the reference numeral 1 designates an input terminal of the amplifier; 2 designates a splitter for distributing an input signal to two paths; 3 designates a first vector regulator for electrically regulating the amplitude and phase of a signal passing through the first path; 4 designates a main amplifier for amplifying the input signal; 5 designates a delay circuit for delaying the input signal distributed to the second path by the splitter 2; 6 designates a splitter/combiner for distributing a part of the output signal of the main amplifier 4 and for combining the distributed output signal with a part of the input signal passing through the delay circuit 5; 7 designates a directional coupler; and 8 designates a pilot signal generator.

The reference numeral 101 designates a distortion detecting loop that includes the splitter 2, first vector regulator 3, main amplifier 4, delay circuit 5 and splitter/combiner 6, and cancels the input signal component by combining the input signal with the output of the main amplifier 4, thereby extracting a distortion component generated by the main amplifier 4. Here, the pilot signal supplied from the pilot signal generator 8 is injected into the output of the main amplifier 4 via the directional coupler 7. The pilot signal is used for controlling a distortion canceling loop 102 as described later.

The reference numeral 9 designates a delay circuit; 10 designates a combiner; 11 designates a second vector regulator; 12 designates an auxiliary amplifier; 13 designates a directional coupler; 102 designates the distortion canceling loop including the delay circuit 9, combiner 10, second vector regulator 11, auxiliary amplifier 12 and directional coupler 13. The reference numeral 14 designates a directional coupler; 15 designates an output terminal of the amplifier; 16 designates a level detector; 17 designates a pilot signal detector; and 18 designates a controller for controlling the first vector regulator 3 and the second vector regulator 11.

Next, the operation of the conventional feedforward amplifier will be described.

The output signal of the main amplifier 4 passes through the splitter/combiner 6, and its major part passing through the delay circuit 9 is supplied to a first input terminal of the combiner 10 installed on the output side. The distortion component extracted by the distortion detecting loop 101 appears at a terminal of the splitter/combiner 6, passes through the second vector regulator 11, is amplified by the auxiliary amplifier 12, and is input to the second input terminal of the combiner 10. The combiner 10 combines the output signal passing through the delay circuit 9 with the distortion component amplified by the auxiliary amplifier 12 in the same amplitude but in the opposite phase, thereby canceling the distortion component and producing the output of small distortion from the output terminal 15.

The optimizing control of the distortion detecting loop 101 in the feedforward amplifier is carried out as follows by controlling the vector regulator 3.

The directional coupler 13 connected to the output of the auxiliary amplifier 12 extracts a part of the signal, the level of which is detected by the level detector 16. The minimum power level of the signal indicates the best canceled state of the signal component, in which the distortion detecting loop 101 is controlled at the optimum state. Therefore, the controller 18 automatically controls the first vector regulator 3 such that the power level detected by the level detector 16 becomes minimum.

Besides, the optimizing control of the distortion canceling loop 102 is carried out as follows by controlling the second vector regulator 11.

The directional coupler 14 installed on the output side of the feedforward amplifier extracts a part of the output signal, and the pilot signal detector 17 detects the pilot signal included in the output signal. The minimum level of the pilot signal indicates the best regulated state of the distortion canceling loop 102. Therefore, the controller 18 automatically controls the second vector regulator 11 such that the pilot signal detected by the pilot signal detector 17 becomes minimum.

Thus, the conventional feedforward amplifier implements the optimum distortion compensation against the ambient temperature variations and deterioration with age by optimally controlling the two loops constituting the feedforward distortion compensation system, that is, the distortion detecting loop 101 and the distortion canceling loop 102.

As conventional feedforward amplifiers, many schemes other than the foregoing method are proposed which carry out the control of the feedforward system by injecting the pilot signal into the loop. All these feedforward amplifiers exploiting the pilot signal have a common problem in that they cannot help outputting the pilot signal from the output terminal. Although the second vector regulator 11 is controlled such that the pilot signal used for controlling the distortion canceling loop 102 is canceled out in principle, the pilot signal is not completely canceled in practice because of the limited control accuracy or nonnegligible control time of the feedforward system. Thus, it is unavoidable that the pilot signal is output from the output terminal 15.

To solve this problem, a filter is often connected to the output terminal of the feedforward amplifier to pass the desired signal and reject the frequency of the pilot signal. However, to achieve the control using the pilot signal at high accuracy, the frequency of the desired signal must be close to that of the pilot signal. Accordingly, it is unavoidable that the filter to separate them becomes large in size and loss, bringing about an increase in size and reduction in efficiency of the amplifier.

In view of this, some schemes are proposed that control the feedforward distortion compensation system without utilizing the pilot signal.

FIG. 2 is a block diagram showing another configuration of the feedforward amplifier disclosed in Japanese patent application publication No. 7-77330. In FIG. 2, the same or like portions to those of FIG. 1 are designated by the same reference numerals, and the description thereof is omitted here.

This feedforward amplifier lacks the pilot signal generator 8 of FIG. 1. It supplies part of the output signal extracted by the directional coupler 14 to the distortion detector 19 for detecting the distortion of the output signal to control the feedforward system in such a manner that the distortion becomes minimum.

This configuration has the following problem.

Specifically, it is very difficult for the feedforward amplifier to carry out the control by detecting the distortion component of its output signal because the distortion component is usually much smaller than the signal component by a factor from 50 dB to 60 dB. Therefore, the distortion detector 19 cannot be realized in practice, or even if it is realized, its circuit configuration will be complicated, resulting in an increase in its size and cost.

Another conventional feedforward amplifier without using the pilot signal is disclosed in Japanese patent application laid-open No. 7-336153. FIG. 3 is a block diagram showing a configuration of the feedforward amplifier. In FIG. 3, the same or like portions to those of FIG. 2 are designated by the same reference numerals, and the description thereof is omitted here. In FIG. 3, the reference numeral 20 designates a controller for controlling the first vector regulator 3; 21 designates a level detector; 22 designates a signal suppressor; 23 designates a controller for controlling the second vector regulator 11; 24 designates a delay circuit; and 25 designates a splitter. The reference numeral 103 designates a distortion detecting loop that comprises the splitters 2 and 25, the first vector regulator 3, the main amplifier 4, the delay circuit 5 and the splitter/combiner 6. FIG. 4 is a block diagram showing a configuration of the signal suppressor 22 as shown in FIG. 3. In FIG. 4, the reference numeral 201 designates a vector regulator, 202 designates a splitter/combiner, 203 designates a delay circuit, 204 designates an amplifier, and 205 designates a level detector.

The feedforward amplifier detects the distortion component signal extracted by the directional coupler 13 by the level detector 21, and controls the first vector regulator 3 by the controller 20 such that the power level of the distortion component signal becomes minimum, thereby carrying out the optimum control of the distortion detecting loop 103. Although the directional coupler 13 is installed before the second vector regulator 11 in FIG. 3, it can be provided after the auxiliary amplifier 12 as in FIG. 1 because the scheme of the optimizing control of the distortion detecting loop 103 is the same as that of FIG. 1.

In FIG. 3, the pilot signal generator 8 as shown in FIG. 1 is not installed. Instead, the splitter 25 provided on the input side of the feedforward amplifier extracts a part of the input signal, and supplies it to the signal suppressor 22 via the delay circuit 24. In addition, the directional coupler 14 on the output side of the feedforward amplifier extracts a part of the output signal, and supplies it to the signal suppressor 22.

The signal suppressor 22 has an internal configuration as shown in FIG. 4. The input signal and output signal of the feedforward amplifier supplied to the signal suppressor 22 are combined by the signal suppressor 22 with the internal configuration including the multi-staged vector regulators 201, splitter/combiners 202 and delay circuits 203. Using the multi-stage internal configuration of the signal suppressor can cancel out the signal component by a factor of 50 dB to 60 dB, leaving the distortion component included in the feedforward amplifier. The distortion component is amplified by the amplifier 204, and detected by the level detector 205. The controller 23 controls the second vector regulator 11 such that the power level of the distortion component is reduced, thereby carrying out the optimizing control of the distortion canceling loop 102.

The conventional feedforward amplifier has a problem of increasing size and complexity because it employs the signal suppressor 22 including the multi-staged splitter/combiners 202, vector regulators 201 and delay circuit 203. In addition, it has a problem in that the adjustment is tedious of the many vector regulators 201 and delay circuits 203 included in the signal suppressor 22.

For example, even the slightest variations in the amplification frequency involved in the change of the channels to be amplified by the feedforward amplifier presents a problem of requiring readjustment of all the vector regulators or all the delay circuits of the signal suppressor 22.

In summary, the conventional feedforward amplifiers with the foregoing configurations have the following problems. First, the feedforward amplifiers that control their feedforward system by injecting the pilot signal have a problem of outputting the residual pilot signal resulting from the control process from the output terminal.

Installing the output filter to eliminate the pilot signal presents another problem of increasing the size and reducing the efficiency of the amplifier because of the large size and loss of the output filter.

As for the configuration as shown in FIG. 2 without the pilot signal generator 8, which controls the feedforward system in such a manner that the distortion becomes minimum by detecting the distortion of the output signal, it is difficult to detect the distortion signal smaller than the signal component by a factor of 50 dB to 60 dB to carry out the control. Thus, it presents a problem in that the distortion detector cannot be implemented in practice, or that even if it can be implemented, its configuration will become complicated, large and expensive.

As for the feedforward amplifier as shown in FIGS. 3 and 4, it presents a problem of increasing its size and complexity because of the signal suppressor 22 with the multi-stage configuration.

In addition, since the slightest variations in the amplification frequency requires the readjustment of all the vector regulators and delay circuits of the signal suppressor 22, it has a problem of requiring complicated adjustment in actual operation.

SUMMARY OF THE INVENTION

The present invention is implemented to solve the foregoing problems. Therefore, it is an object of the present invention to provide a feedforward amplifier that can implement favorable distortion characteristic unaffected by the variations in the ambient temperature or deterioration with age, and that has a small size and high efficiency, and can cope with the frequency changes with ease.

According to a first aspect of the present invention, there is provided a feedforward amplifier that includes a distortion detecting loop having a first vector regulator, and a distortion canceling loop having a second vector regulator, and that carries out feedforward distortion compensation, the feedforward amplifier comprising: a directional coupler for extracting a part of an output signal; a first splitter for extracting a part of an input signal; a delay circuit for delaying the input signal extracted by the first splitter; a combiner for combining the input signal delayed by the delay circuit with the output signal extracted by the directional coupler; a local oscillator for generating a signal of a prescribed frequency; a frequency converter for downconverting an output of the combiner to a low frequency using the signal generated by the local oscillator; a first filter for passing a distortion component and for rejecting a signal component of an output of the frequency converter; a distortion component detector for measuring the distortion component output from the first filter; and a second vector regulator controller for controlling the second vector regulator of the distortion canceling loop such that the distortion component measured by the distortion component detector becomes minimum.

According to this, the feedforward amplifier can obviate the need for employing a circuit configuration operating at a high frequency in the control for minimizing the distortion component of the second vector regulator in the distortion canceling loop. This offers an advantage of being able to facilitate implementing the favorable distortion characteristic resistant to variations in the ambient temperature or deterioration with age, to facilitate reduction in size and increase in efficiency, and to cope with the frequency change of the input signal by varying the local oscillation frequency used for the frequency conversion that converts the output of the combiner to the low frequency by the frequency converter.

Here, the feedforward amplifier can further comprise: a third vector regulator interposed between the delay circuit and the combiner for changing pass amplitude and pass phase of an output of the delay circuit; a second splitter interposed between the combiner and the first filter for dividing a signal supplied to it; a second filter for passing a signal component and for rejecting a distortion component of a signal delivered by the second splitter; a signal component detector for measuring the signal component output from the second filter; and a third vector regulator controller for controlling the third vector regulator such that the signal component measured by the signal component detector becomes minimum.

According to this, the feedforward amplifier can obviate the need for the distortion component detector and signal component detector to measure the distortion component and signal component at the radio frequency. This offers an advantage of being able to improve the detection accuracy, and to cancel out the signal component without failure at high accuracy using the input signal and output signal in spite of the variations in the circuit characteristic due to the deterioration with age or ambient temperature variations, thereby implementing good feedforward distortion compensation.

The feedforward amplifier can further comprise: a third vector regulator interposed between the delay circuit and the combiner for changing pass amplitude and pass phase of an output of the delay circuit; a second splitter interposed between the combiner and the first filter for dividing a signal supplied to it; a signal component detector for measuring a signal component delivered by the second splitter; and a third vector regulator controller for controlling the third vector regulator such that the signal component measured by the signal component detector becomes minimum.

According to this, the feedforward amplifier can obviate the second filter for passing the signal component and for rejecting the distortion component of the first low frequency signal distributed by the second splitter, which offers an advantage of being able to implement the feedforward amplifier with the reduced size and cost by an amount of removing the second filter.

The second splitter can be interposed between the combiner and the frequency converter.

According to this, the feedforward amplifier can detect in the radio frequency band the output power obtained by combining the output of the third vector regulator and the part of the output signal extracted by the directional coupler. It offers an advantage of being able to implement the cancellation of the signal component by the combining at practical accuracy, and to carry out the control of the feedforward distortion compensation system at high accuracy.

The distortion detecting loop can comprise an input side splitter for dividing the input signal, and a main amplifier for amplifying a first part of the input signal divided by the input side splitter, wherein the first splitter can further divide a second part of the input signal divided by the input side splitter.

According to this, the feedforward amplifier can obviate the need for installing a splitter on the main path of the input signal from the input terminal of the feedforward amplifier to the splitter/combiner via the main amplifier, that is, on the path of the signal constituting the major part of the output signal of the feedforward amplifier. Thus, it offers an advantage of being able to prevent the reduction in the total gain of the amplifier due to the loss of the splitter, and to implement a favorable distortion characteristic resistant to the variations in the ambient temperature or deterioration with age.

The distortion detecting loop can comprise an input side splitter for dividing the input signal, a main amplifier for amplifying a first part of the input signal divided by the input side splitter, and an intra-distortion-detecting-loop delay circuit for delaying a second part of the input signal divided by the input side splitter, wherein the first splitter can be interposed into a path on an output side of the intra-distortion-detecting-loop delay circuit.

According to this, the feedforward amplifier can utilize the delay circuit in the distortion detecting loop as a part of the delay circuit for delaying the input signal, which is installed on the path of the input signal to be combined with the output signal. Thus, it offers an advantage of being able to miniaturize the delay circuit by an amount corresponding to the delay the input signal undergoes through the delay circuit in the distortion detecting loop, thereby reducing the total size of the amplifier.

According to a second aspect of the present invention, there is provided a feedforward amplifier that includes a distortion detecting loop having a first vector regulator, and a distortion canceling loop having a second vector regulator, and that carries out feedforward distortion compensation, the feedforward amplifier comprising: a first splitter for extracting a part of an input signal; a delay circuit for delaying the input signal extracted by the first splitter; a third vector regulator for changing pass amplitude and pass phase of an output of the delay circuit; a local oscillator for generating a signal of a prescribed frequency; a first frequency converter for down-converting an output of the third vector regulator to a low frequency using the signal generated by the local oscillator; a directional coupler for extracting a part of an output signal; a second frequency converter for down-converting an output of the directional coupler to a low frequency using the signal generated by the local oscillator; a combiner for combining an output of the first frequency converter and an output of the second frequency converter; a second splitter for dividing an output of the combiner; a first filter for passing a distortion component and for rejecting a signal component of a first output of the second splitter; a distortion component detector for measuring the distortion component output from the first filter; a second vector regulator controller for controlling the second vector regulator of the distortion canceling loop such that the distortion component measured by the distortion component detector becomes minimum; a second filter for passing a signal component and for rejecting a distortion component of a second output of the second splitter; a signal component detector for measuring the signal component output from the second filter; and a third vector regulator controller for controlling the third vector regulator such that the signal component measured by the signal component detector becomes minimum.

According to this, the feedforward amplifier can obviate the need for employing radio frequency connecting wire as the connecting wire on the input side of the combiner that combines the output of the third vector regulator and the output signal extracted by the directional coupler, thereby miniaturizing the amplifier. In addition, the feedforward amplifier can utilize a low frequency circuit configuration after combining the output of the third vector regulator and the output signal extracted by the directional coupler. Thus, it offers an advantage of being able facilitate reducing the size and cost of the amplifier.

According to a third aspect of the present invention, there is provided a feedforward amplifier that includes a distortion detecting loop having a first vector regulator, and a distortion canceling loop having a second vector regulator, and that carries out feedforward distortion compensation, the feedforward amplifier comprising: a first splitter for extracting a part of an input signal; a local oscillator for generating a signal of a prescribed frequency; a first frequency converter for down-converting the input signal extracted by the first splitter to a low frequency using the signal generated by the local oscillator; a delay circuit for delaying an output signal of the first frequency converter; a third vector regulator for changing pass amplitude and pass phase of an output of the delay circuit; a directional coupler for extracting a part of an output signal; a second frequency converter for down-converting an output of the directional coupler to a low frequency using the signal generated by the local oscillator; a combiner for combining an output of the second frequency converter and a signal passing through the third vector regulator; a second splitter for dividing an output of the combiner; a first filter for passing a distortion component and for rejecting a signal component of a first output of the second splitter; a distortion component detector for measuring the distortion component output from the first filter; a second vector regulator controller for controlling the second vector regulator of the distortion canceling loop such that the distortion component measured by the distortion component detector becomes minimum; a second filter for passing a signal component and for rejecting a distortion component of a second output of the second splitter; a signal component detector for measuring the signal component output from the second filter; and a third vector regulator controller for controlling the third vector regulator such that the signal component measured by the signal component detector becomes minimum.

According to this, the feedforward amplifier can configure all the circuit components after the frequency conversion by using the low frequency components. Thus, it offers an advantage of being able to facilitate reducing the size and cost of the amplifier.

DETAILED DESCRIPTION OF THE PREFERRED EMBODIMENTS

The embodiments of the present invention will now be described with reference to the accompanying drawings.
Embodiment 1

Figure 5:
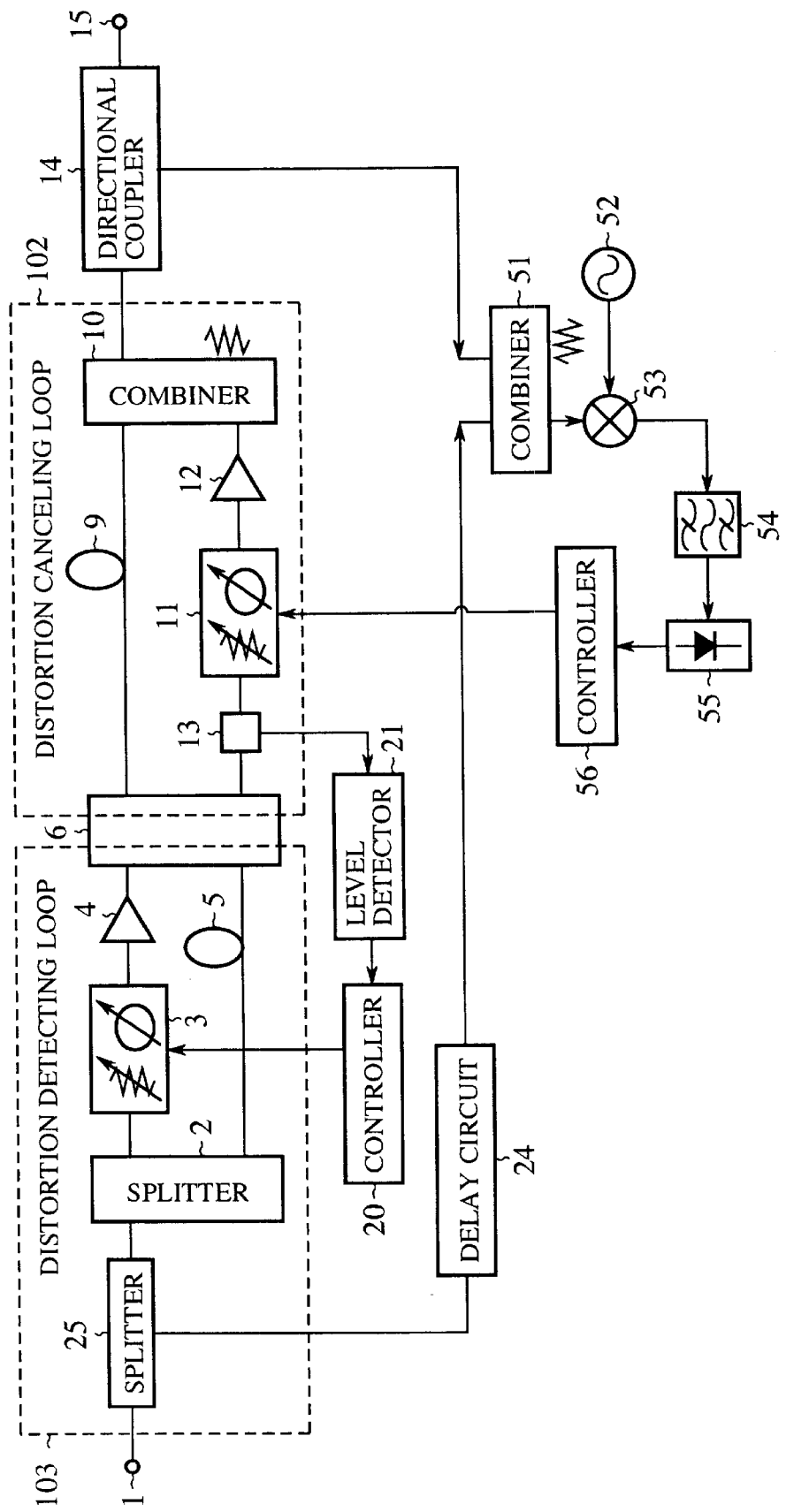
FIG. 5 is a block diagram showing a configuration of an embodiment 1 of the feedforward amplifier in accordance with the present invention.

FIG. 5 is a block diagram showing a configuration of an embodiment 1 of the feedforward amplifier in accordance with the present invention. In FIG. 5, the reference numeral 1 designates an input terminal of the amplifier; 2 designates a splitter (input side splitter) for delivering the input signal supplied from the input terminal 1 to two paths; 3 designates a first vector regulator for electrically adjusting the amplitude and phase of the signal passing through the first path; 4 designates a main amplifier for amplifying the input signal; 5 designates a delay circuit (a delay circuit in the distortion detecting loop) for delaying the input signal that is delivered by the splitter 2 and passes through the second path; and 6 designates a splitter/combiner for dividing a part of the output signal of the main amplifier 4, for supplying a first part of that signal to the delay circuit 9, and for combining a second part of the signal and the part of the input signal passing through the delay circuit 5 to be supplied to a directional coupler 13.

The reference numeral 103 designates a distortion detecting loop comprising the splitters 2 and 25, the first vector regulator 3, the main amplifier 4, the delay circuit 5 and the splitter/combiner 6. It cancels out the input signal component by combining the input signal with the output of the main amplifier 4, thereby extracting the distortion component of the main amplifier 4.

The reference numeral 9 designates the delay circuit; 10 designates a combiner; 11 designates a second vector regulator; 12 designates an auxiliary amplifier; 13 designates the directional coupler for extracting part of the output signal; 102 designates a distortion canceling loop comprising the delay circuit 9, the combiner 10, the second vector regulator 11, the auxiliary amplifier 12 and the directional coupler 13. The reference numeral 14 designates a directional coupler; and 15 designates an output terminal of the amplifier. The reference numeral 20 designates a controller for controlling the first vector regulator 3; 21 designates a level detector; 24 designates a delay circuit for delaying the input signal extracted by a splitter 25; and 25 designates the splitter (first splitter) for extracting a part of the input signal.

The reference numeral 51 designates a combiner for combining the input signal delayed by the delay circuit 24 with the output signal extracted by the directional coupler 14; 52 designates a local oscillator for generating a signal of a prescribed frequency; 53 designates a frequency converter for down-converting the output of the combiner 51 to a low frequency signal using the signal output from the local oscillator 52; 54 designates a filter (first filter), a bandpass filter for rejecting the signal component and for passing the distortion component of the signal output from the frequency converter 53; 55 designates a power detector (distortion component detector) for measuring the distortion component output from the filter 54; and 56 designates a controller (second vector regulator controller) for controlling the second vector regulator 11 of the distortion canceling loop 102 such that the distortion component detected by the power detector 55 becomes minimum.

Next, the operation of the present embodiment 1 will be described.

In the present embodiment 1 of the feedforward amplifier, the output signal of the main amplifier 4 passes through the splitter/combiner 6, and the major part thereof passes through the delay circuit 9 to be supplied to the first input terminal of the combiner 10 installed on the output side. The distortion component extracted by the distortion detecting loop 103 appears at a terminal of the splitter/combiner 6, passes through the directional coupler 13 and second vector regulator 11, and is amplified by the auxiliary amplifier 12 to be input to the second input terminal of the combiner 10. The combiner 10 combines the output signal passing through the delay circuit 9 with the distortion component amplified by the auxiliary amplifier 12 in the same amplitude but in the opposite phase to cancel the distortion component, thereby producing the output with little distortion from the output terminal 15.

The feedforward amplifier carries out the optimizing control of the distortion detecting loop 103 as follows by controlling the vector regulator 3.

Specifically, the level detector 21 detects the distortion component signal extracted by the directional coupler 13, and the controller 20 controls the first vector regulator 3 such that the power level of the distortion component becomes minimum. Thus, the optimum control of the distortion detecting loop 103 is carried out. In this case, the directional coupler 13 can be installed after the auxiliary amplifier 12 without any problem.

On the other hand, the combiner 51 is supplied with the part of the signal extracted by the splitter 25 installed at the input side of the feedforward amplifier via the delay circuit 24. The combiner 51 is also supplied with the part of the output signal of the feedforward amplifier from the directional coupler 14 on the output side. Thus, the combiner 51 combines the output signal of the feedforward amplifier supplied from the directional coupler 14 with the input signal extracted by the splitter 25 installed at the input side. By combining the input signal with the output signal in the opposite phase but with the same amplitude, the signal component of the output signal of the feedforward amplifier is canceled out, leaving only the distortion component.

The delay circuit 24 is installed to place the input signal and the output signal in the opposite phase but in the same amplitude at the combiner 51.

To bring the input signal and output signal in the opposite phase but in the same amplitude perfectly at the combiner 51 is difficult because of the accuracy of the circuit components. It is practical to assume that the signal component is canceled out by a factor of about 30 dB. The ratio of the signal component to the distortion component of the feedforward amplifier is from 50 dB to 60 dB. Accordingly, the signal component is greater than the distortion component by 20 dB to 30 dB even at the output of the combiner 51. Taking account of this, the frequency converter 53 down-converts the output of the combiner 51 to a sufficiently lower frequency using the output of the local oscillator 52, and the filter 54, rejecting the signal component and passing the distortion component, extracts only the distortion component. The power of the distortion component is detected by the power detector 55. When the power of the distortion component is minimum, the distortion canceling loop 102 is adjusted to the optimum state of the feedforward distortion compensation system. Therefore, the controller 56 controls the second vector regulator 11 such that the power detected by the power detector 55 becomes minimum.

Incidentally, it is very difficult to fabricate a filter capable of extracting only the distortion component directly from the radio frequency output of the combiner 51 without down-converting it.

As described above, since the present embodiment 1 does not use the pilot signal, the pilot signal is not produced from the output terminal 15. Thus, the present embodiment 1 can obviate the filter for eliminating the pilot signal, and offers an advantage of being able to miniaturize the feedforward amplifier with ease.

In addition, since the present embodiment 1 can prevent the efficiency of the amplifier from being decreased by the loss of the filter, it can configure a high efficiency amplifier, thereby offering an advantage of being able to promote the miniaturization and improve the efficiency of devices utilizing the feedforward amplifier.

Furthermore, since the present embodiment 1 cancels out the signal component by the combiner 51 that combines the input signal extracted by the splitter 25 with the output signal extracted by the directional coupler 14, the power difference between the frequency components of the signal and of the distortion passing through the filter 54 can be a feasible value from 30 dB to 40 dB, for example. Thus, it offers an advantage of being able to implement the feedforward amplifier enabling the reduction in its size and cost.

Figure 1:
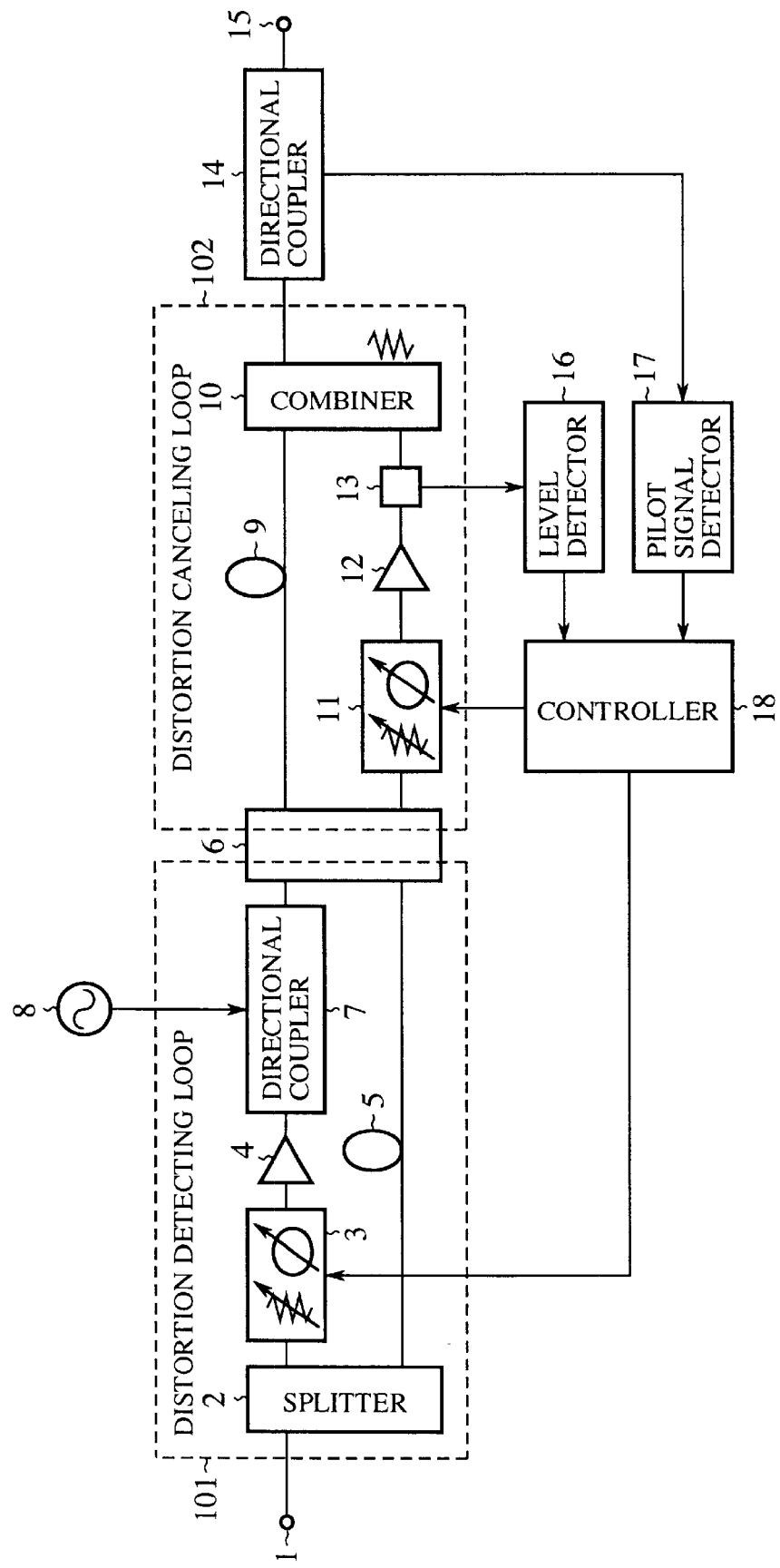
FIG. 1 is a block diagram showing a configuration of a feedforward amplifier disclosed in Japanese patent application publication No. 7-77330.
Figure 2:
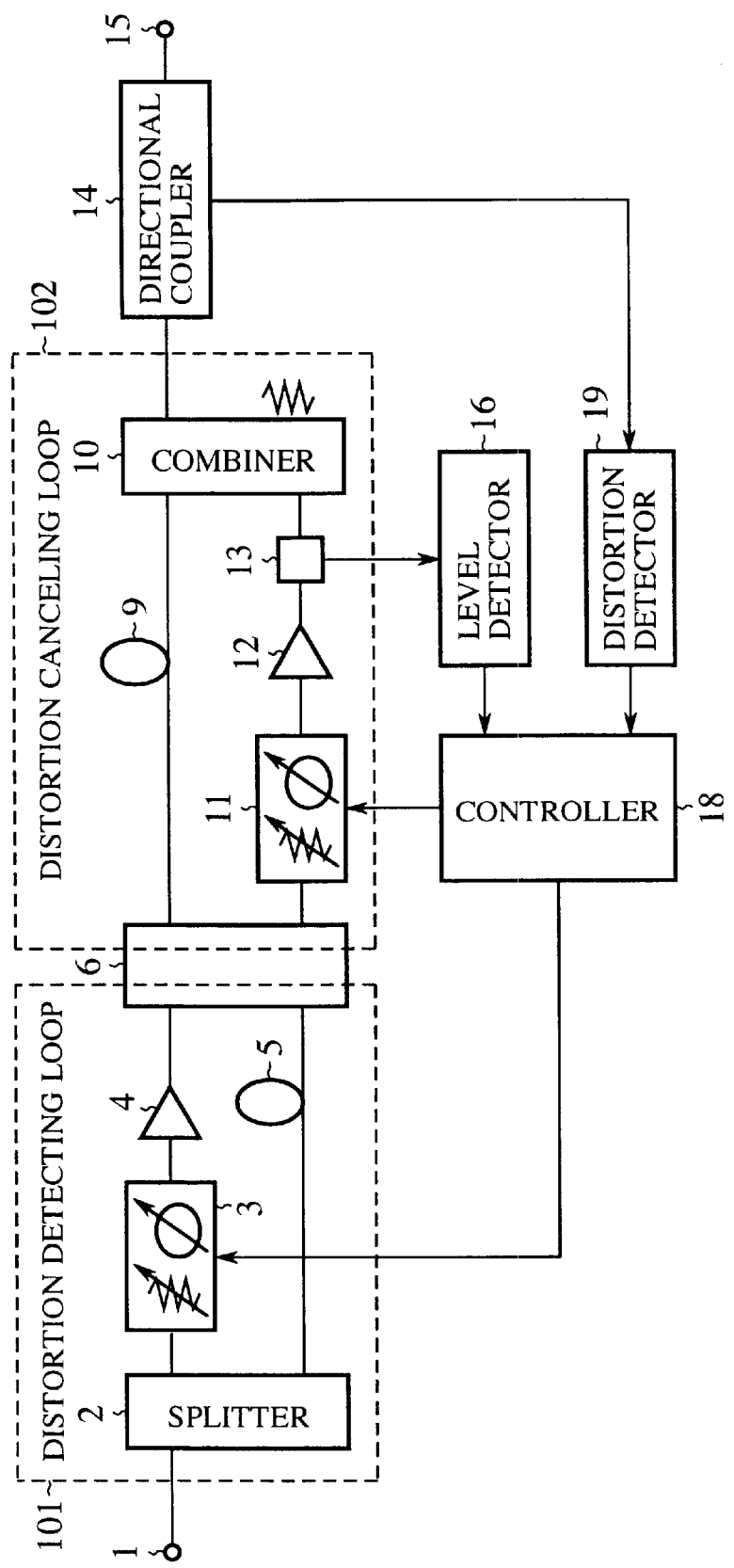
FIG. 2 is a block diagram showing another configuration of the feedforward amplifier disclosed in Japanese patent application publication No. 7-77330.
Figure 3:
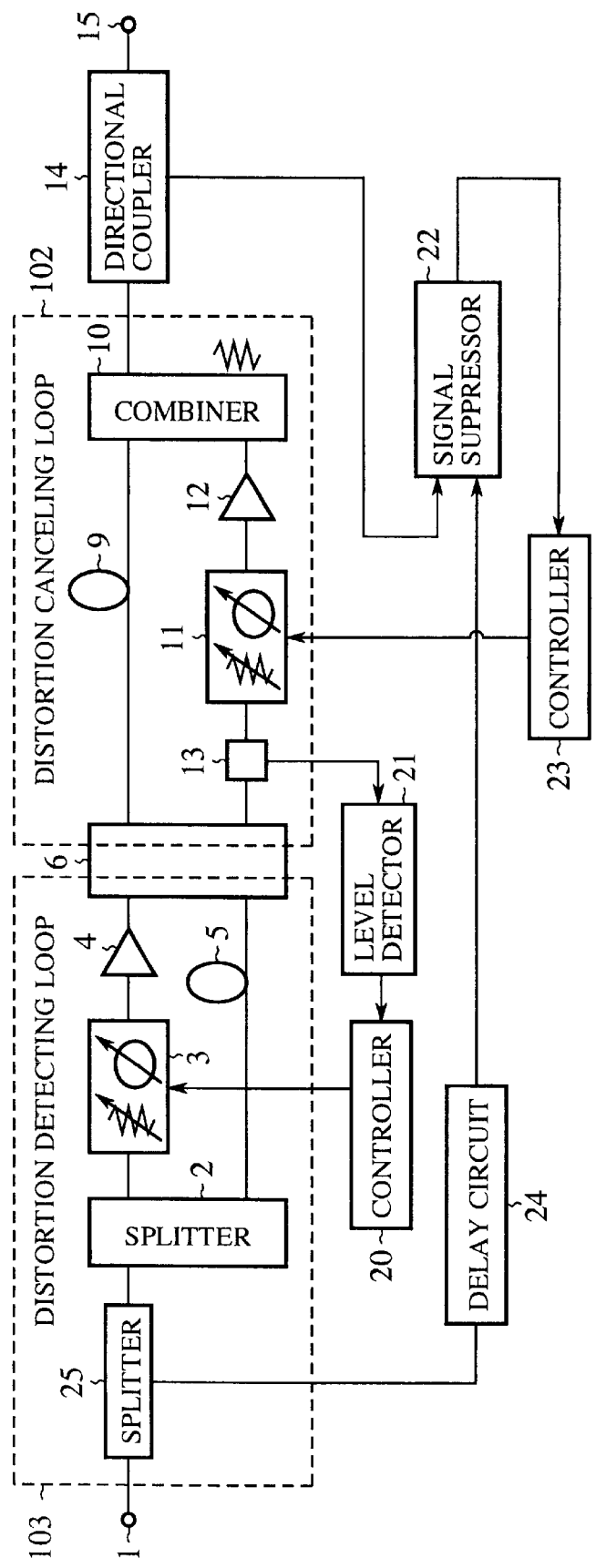
FIG. 3 is a block diagram showing a configuration of a feedforward amplifier disclosed in Japanese patent application laid-open No. 7-336153.
Figure 4:
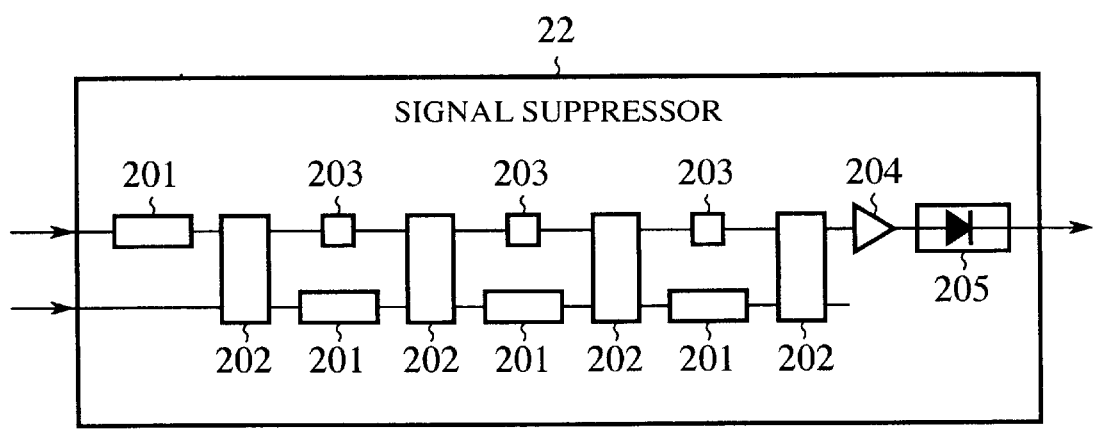
FIG. 4 is a block diagram showing a configuration of the signal suppressor of the feedforward amplifier disclosed in Japanese patent application laid-open No. 7-336153.

Moreover, since the present embodiment 1 detects the power of the distortion component using the low frequency filter 54 after down-converting the radio-frequency signal to the low frequency by the frequency converter 53, it is unnecessary to achieve signal suppression of about 60 dB in the radio frequency as the feedforward amplifier of FIGS. 3 and 4, but the suppression of about 30 dB is sufficient. Therefore, the multi-stage signal suppressor 22 as shown in FIG. 4 is not required, offering an advantage of being able to implement a small size, practical feedforward amplifier.

In addition, the present embodiment 1 can easily cope with the frequency change in amplification by varying the oscillation frequency of the local oscillator 52. In this case, employing a voltage controlled oscillator (VCO) as the local oscillator 52 enables the oscillation frequency to be electrically controlled easily, offering an advantage of being able to implement a feedforward amplifier that can flexibly deal with the change in the amplification frequency.

Embodiment 2

Figure 6:
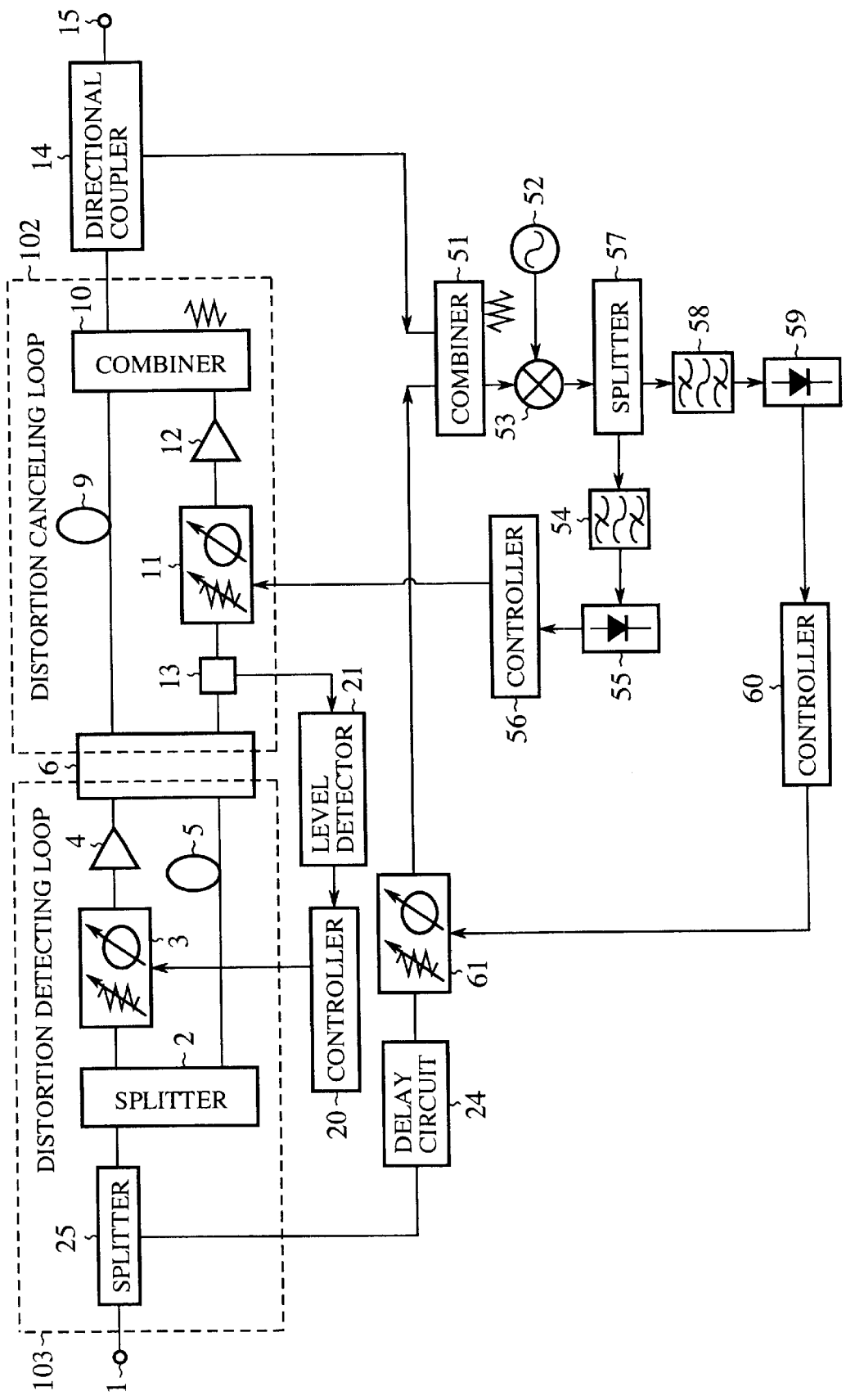
FIG. 6 is a block diagram showing a configuration of an embodiment 2 of the feedforward amplifier in accordance with the present invention.

FIG. 6 is a block diagram showing a configuration of an embodiment 2 of the feedforward amplifier. In FIG. 6, the same or like portions to those of FIG. 5 are designated by the same reference numerals, and the description thereof is omitted here. In FIG. 6, the reference numeral 57 designates a splitter (second splitter) interposed between the combiner 51 and the filter 54 for dividing the signal; 58 designates a filter (second filter), a bandpass filter for rejecting the distortion component and passing the signal component of the signal delivered by the splitter 57; 59 designates a power detector (signal component detector) for measuring the power of the signal component output from the filter 58; 60 designates a controller (third vector regulator controller) for controlling a third vector regulator 61 such that the signal component measured by the power detector 59 becomes minimum; and 61 designates the third vector regulator.

Next, the operation of the present embodiment 2 will be described.

A part of the input signal divided by the splitter 25 passes through the delay circuit 24 and the third vector regulator 61 to be supplied to the combiner 51. The combiner 51 combines the input signal with the output signal extracted by the directional coupler 14, and the frequency converter 53 down-converts the output of the combiner 51. The splitter 57 delivers a first part of the output of the frequency converter 53 to the filter 54 that passes only the distortion component to be detected by the power detector 55.

The splitter 57 supplies a second part of the output to the filter 58 so that the power detector 59 detects the power level of the signal component.

To improve the accuracy of the cancellation of the signal component by the combiner 51 that combines the input signal with the output signal for the cancellation, the controller 60 controls the third vector regulator 61 such that the power level detected by the power detector 59 becomes minimum.

As for the distortion component, on the other hand, the power detector 55 detects its power level and supplies it to the controller 56 that controls the second vector regulator 11 such that the power level becomes minimum. The control of the second vector regulator 11 by the controller 56 is carried out independently of the control of the third vector regulator 61 by the controller 60.

Although the third vector regulator 61 is installed on the path on the input signal side, it can be interposed into the path on the output signal side from the directional coupler 14.

As described above, the present embodiment 2 can achieve similar advantages of the embodiment 1. In addition, it can always carry out the cancellation of the signal component at high accuracy by the combiner 51 using the input signal and output signal, in spite of the changes in the characteristics of the splitter 25, delay circuit 24, directional coupler 14 and combiner 51 due to the deterioration with age or ambient temperature variations. Thus, the present embodiment 2 can reduce the residual signal component due to insufficient cancellation to a favorable level, and reduce the (adverse) effect of the residual signal component on the power detection of the distortion component by the power detector 55. Therefore, the power detector 55 can detect the power of the distortion component at high detection accuracy, and the controller 56 can control the second vector regulator 11 satisfactorily, thereby always maintaining the feedforward distortion compensation at a good condition.

Furthermore, even when the frequency of the amplification changes, since the frequency characteristics of the splitter 25, delay circuit 24, directional coupler 14 and combiner 51 can be compensated for by adjusting the third vector regulator 61, the combiner 51 can always cancel the signal component at high accuracy, thereby implementing satisfactory feedforward distortion compensation.

Embodiment 3

Figure 7:
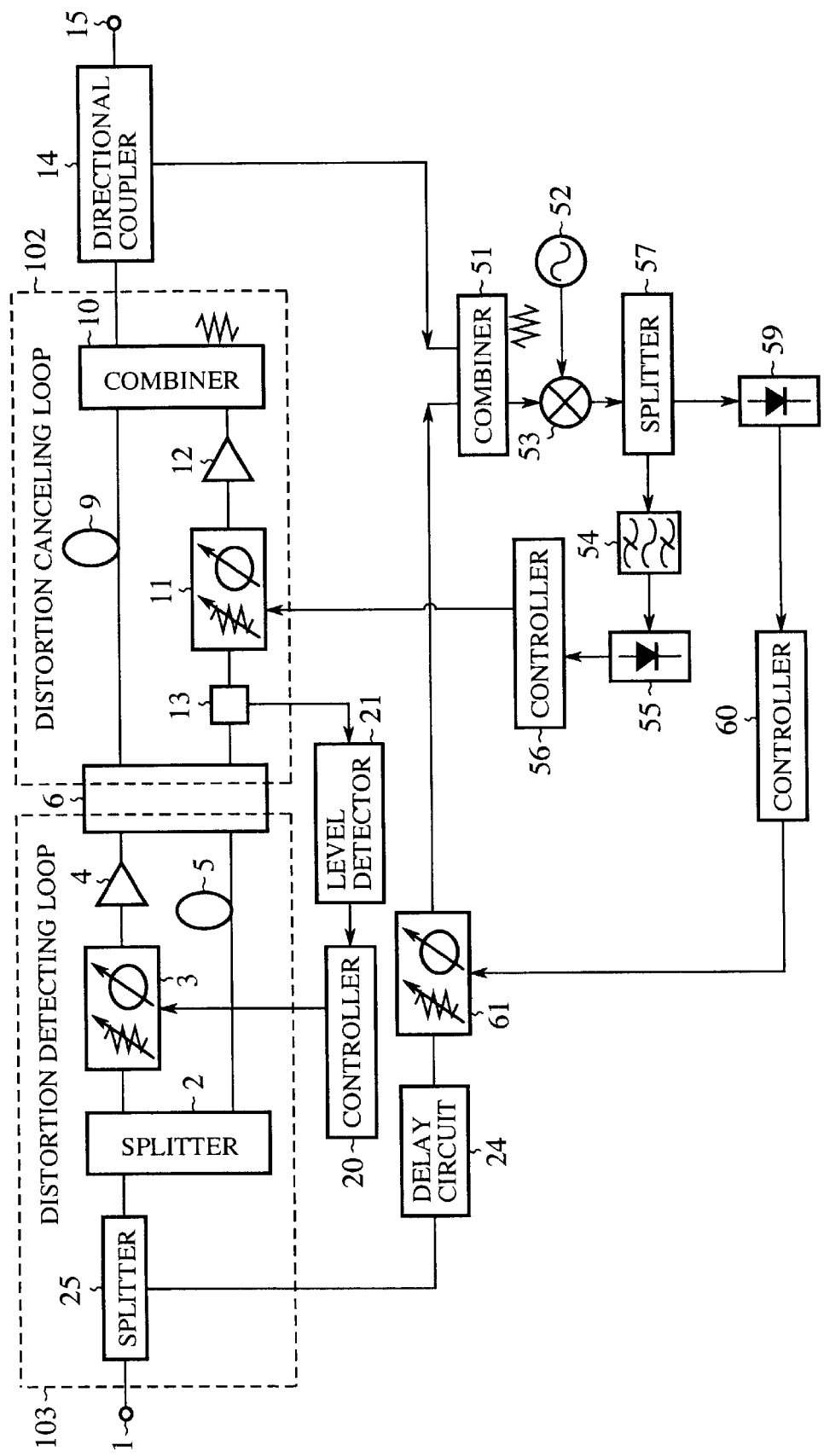
FIG. 7 is a block diagram showing a configuration of an embodiment 3 of the feedforward amplifier in accordance with the present invention.

FIG. 7 is a block diagram showing a configuration of the present embodiment 3 of the feedforward amplifier. In FIG. 7, the same or like portions to those of FIG. 6 are designated by the same reference numerals, and the description thereof is omitted here.

The present embodiment 3 of the feedforward amplifier is configured by eliminating the filter 58 for passing the signal frequency component from the configuration as shown in FIG. 6.

Next, the operation of the present embodiment 3 will be described.

The accuracy of the cancellation of the signal component by the combiner 51 is determined by the accuracy of the components of the system, and is about 30 dB at best. Accordingly, the signal component occupies the major portion of the output of the frequency converter 53. As a result, it usually presents little problem to eliminate the filter for passing only the signal component from before the power detector 59 for detecting the power level of the signal component.

Thus, the configuration as shown in FIG. 7 that removes the filter 58 for passing the signal frequency component from the configuration as shown in FIG. 6 can not only achieve the advantages of the foregoing embodiment 2, but also offer an advantage of being able to implement the reduction in size and cost of the feedforward amplifier.

Embodiment 4

Figure 8:
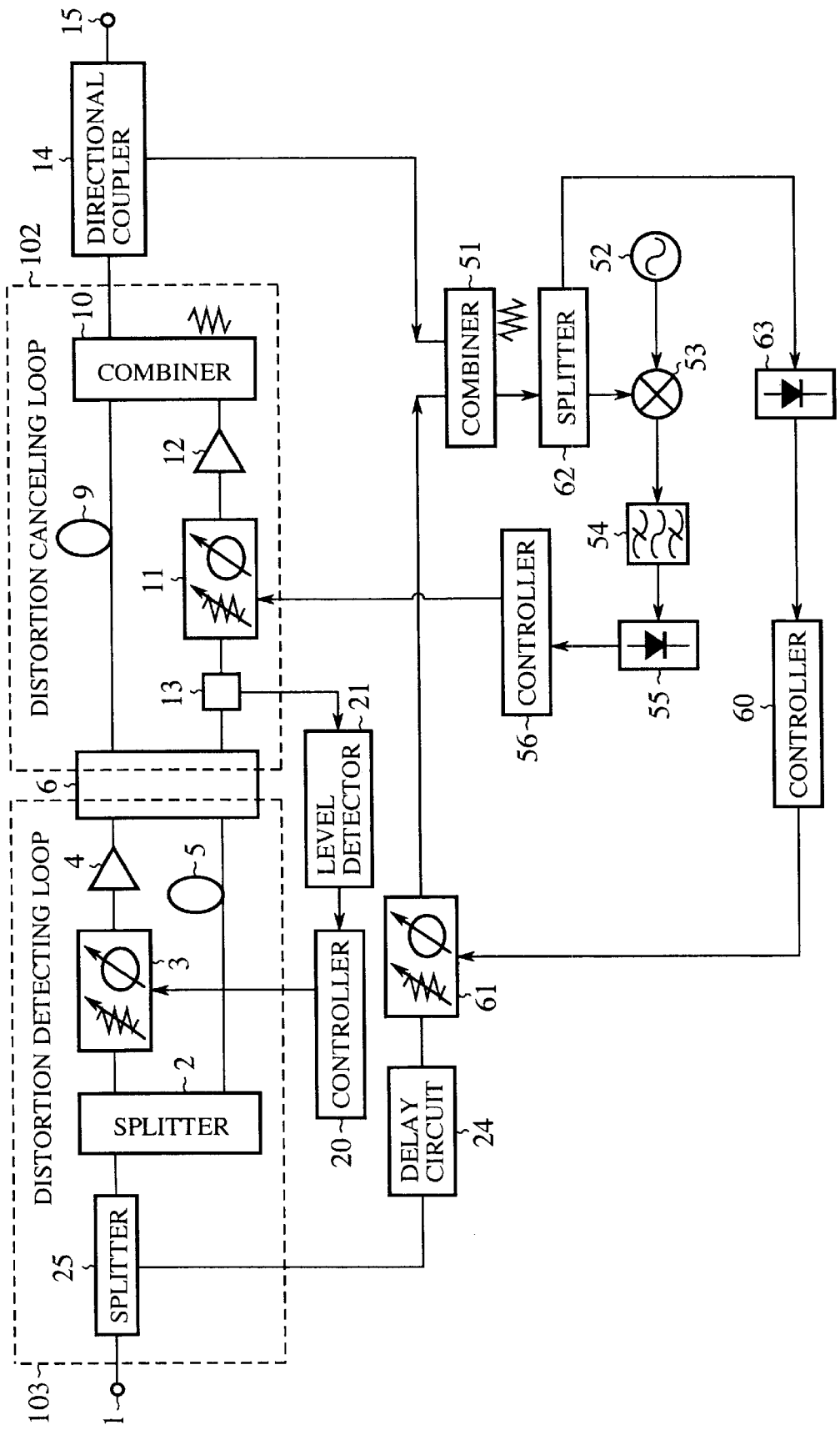
FIG. 8 is a block diagram showing a configuration of an embodiment 4 of the feedforward amplifier in accordance with the present invention.

FIG. 8 is a block diagram showing a configuration of the present embodiment 4 of the feedforward amplifier. In FIG. 8, the same or like portions to those of FIG. 7 are designated by the same reference numerals, and the description thereof is omitted here. In FIG. 8, the reference numeral 62 designates a splitter (second splitter) for dividing the output of the combiner 51; and 63 designates a radio-frequency power detector (signal component detector) for detecting the power of the signal delivered by the splitter 62.

Next, the operation of the present embodiment 4 will be described.

The output of the combiner 51 is divided by the splitter 62, and the first part thereof is supplied to the frequency converter 53 that down-converts it to the low frequency. The low frequency signal passes through the filter 54 for passing the distortion component frequency and is supplied to the power detector 55 so that the controller 56 controls the second vector regulator 11 such that the power level of the distortion component detected by the power detector 55 becomes minimum.

The second part delivered by the splitter 62 is directly supplied to the radio-frequency power detector 63 that detects its power level. The controller 60 controls the third vector regulator 61 such that the power level becomes minimum to reduce the signal component in the output of the combiner 51, thereby improving the detection accuracy of the distortion component by the level detector 21.

As described in the foregoing embodiment 3, although the signal component in the output of the combiner 51 is canceled to some extent, it still occupies the major portion of the output. Accordingly, the present embodiment 4 directly detects the output power of the combiner 51 in the radio frequency band, and controls the third vector regulator 61 such that the power becomes minimum. Thus, the present embodiment 4 can implement the cancellation of the signal component by the combiner 51 at practical accuracy, offering an advantage of being able to provide the feedforward amplifier capable of controlling the feedforward distortion compensation system at high accuracy.

Embodiment 5

Figure 9:
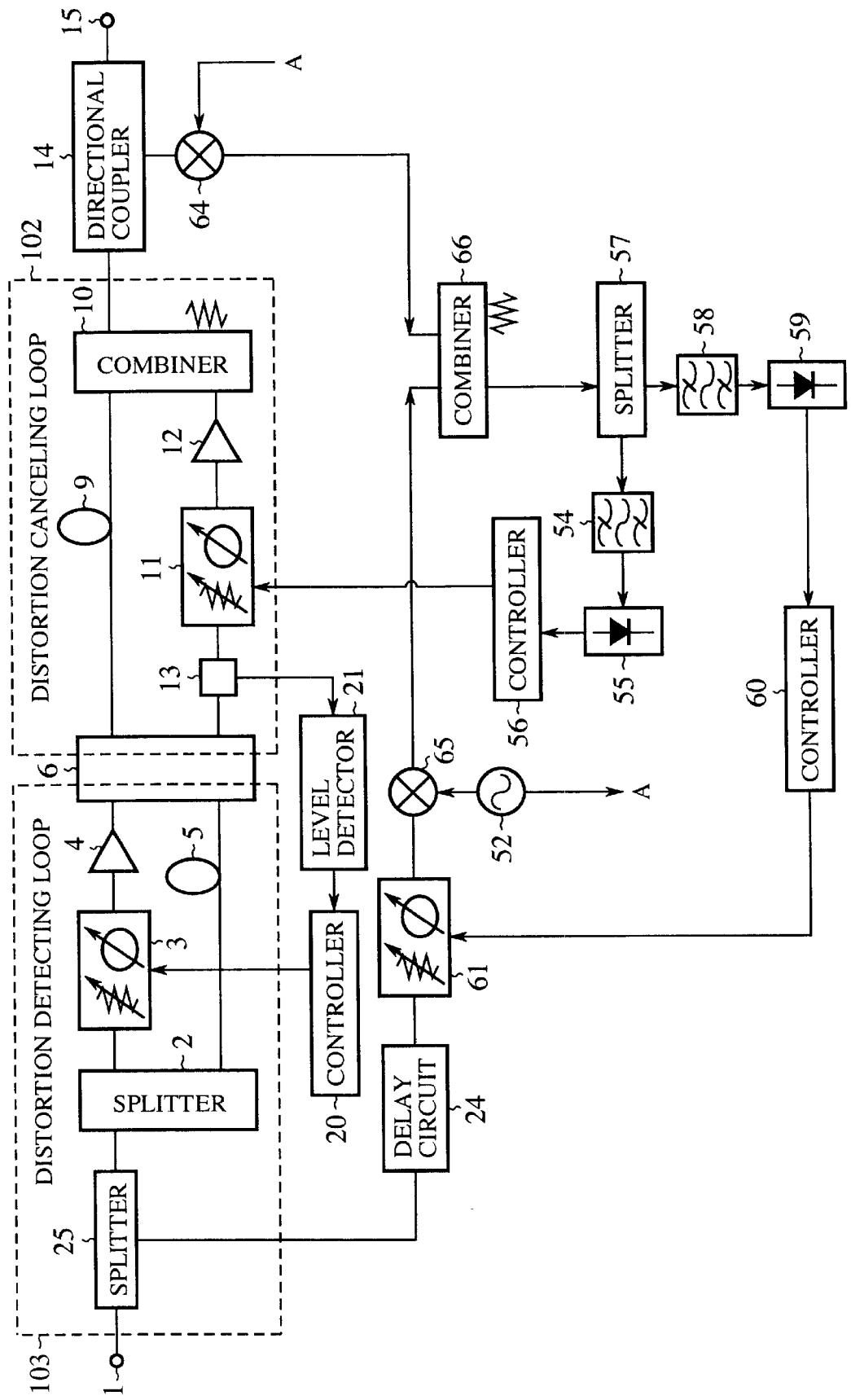
FIG. 9 is a block diagram showing a configuration of an embodiment 5 of the feedforward amplifier in accordance with the present invention.

FIG. 9 is a block diagram showing a configuration of the present embodiment 5 of the feedforward amplifier. In FIG. 9, the same or like portions to those of FIG. 6 are designated by the same reference numerals, and the description thereof is omitted here. In FIG. 9, the reference numeral 64 designates a frequency converter (second frequency converter) for down-converting the output signal split by the directional coupler 14 to a low frequency using the signal output from the local oscillator 52; 65 designates a frequency converter (first frequency converter) for down-converting the output of the third vector regulator 61 to a low frequency using the signal output from the local oscillator 52; and 66 designates a combiner for combining the outputs of the frequency converters 64 and 65.

Next, the operation of the present embodiment 5 will be described.

A part of the input signal divided by the splitter 25 passes through the delay circuit 24 and the third vector regulator 61, and is down-converted to the low frequency signal by the frequency converter 65.

On the other hand, a part of the output signal extracted by the directional coupler 14 is down-converted to the low frequency signal by the frequency converter 64. The combiner 66 combines the outputs of the frequency converters 64 and 65 in the same amplitude but in the opposite phase to cancel out the signal component. The output signal of the combiner 66 is divided into two portions by the splitter 57. The first portion passes through the filter 54 that passes only the distortion component frequency, and is supplied to the power detector 55. The second portion passes through the filter 58 that passes only the signal component frequency, and is supplied to the power detector 59.

As in the embodiment 2 described before, the controllers 56 and 60 control the second vector regulator 11 and third vector regulator 61, respectively.

The present embodiment 5 of the feedforward amplifier differs from the foregoing embodiment 2 in that the combiner 66 combines the two low frequency signals, that is, the input signal divided by the splitter 25 and the output signal extracted by the directional coupler 14, to extract the distortion component by canceling out the signal component. Accordingly, the combiner 66 can be a combiner for the low frequency.

As described above, the present embodiment 5 offers the same advantages of the foregoing embodiment 2. In addition, it can obviate the radio-frequency connecting wire on the input side of the combiner 66, thereby offering an advantage of being able to provide greater flexibility of wiring, and by extension to miniaturize the device.

Furthermore, the present embodiment 5 can implement the circuit configuration using the low frequency combiner 66, splitter 57 and filters 54 and 58, making it easier to integrate them into an IC. Thus, it offers an advantage of being able to implement the feedforward amplifier that can reduce its size and cost with ease.

Embodiment 6

Figure 10:
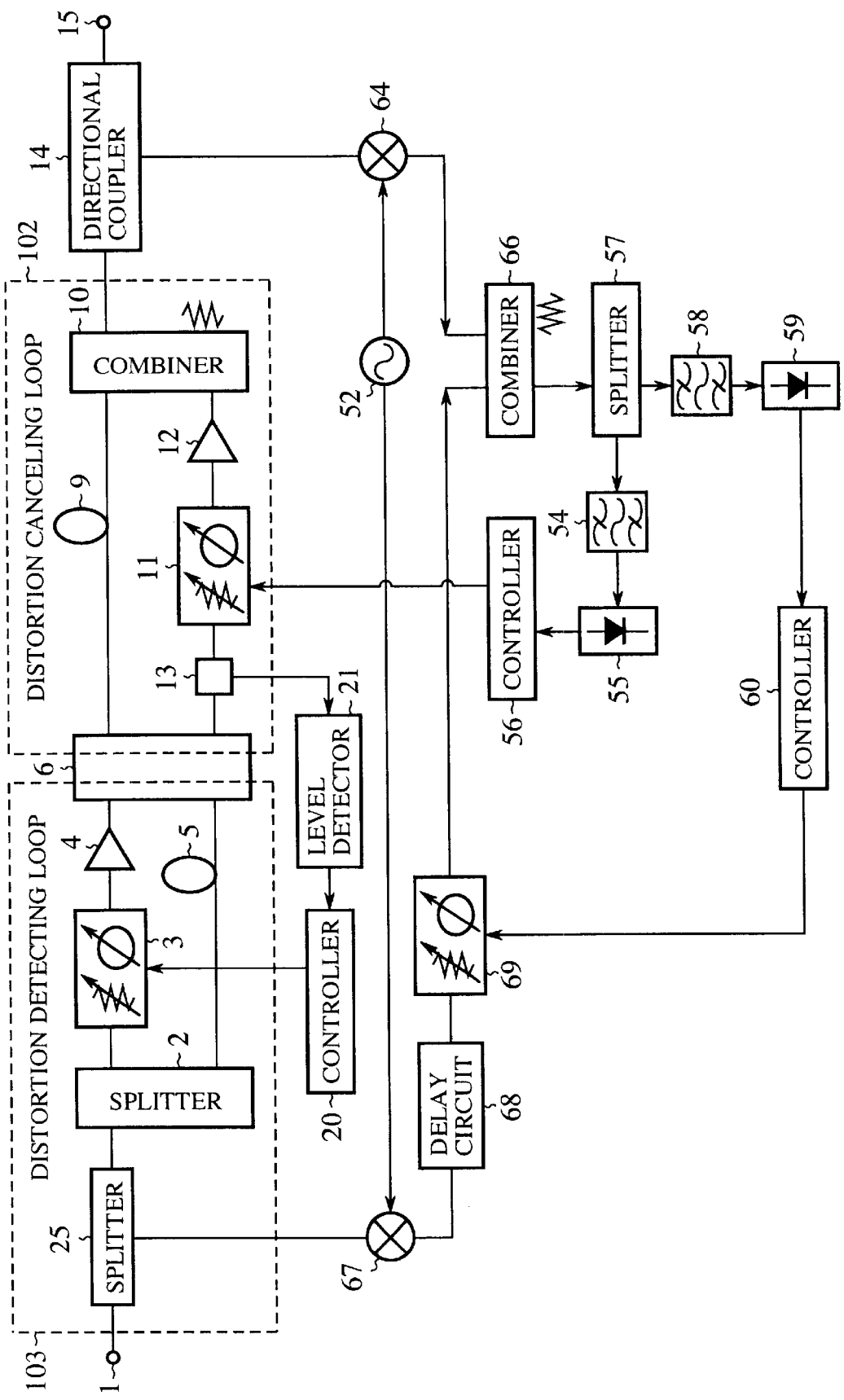
FIG. 10 is a block diagram showing a configuration of an embodiment 6 of the feedforward amplifier in accordance with the present invention.

FIG. 10 is a block diagram showing a configuration of the present embodiment 6 of the feedforward amplifier. In FIG. 10, the same or like portions to those of FIG. 9 are designated by the same reference numerals, and the description thereof is omitted here. In FIG. 10, the reference numeral 67 designates a frequency converter (first frequency converter) for down-converting a part of the input signal divided by the splitter 25 by using the output signal from the local oscillator 52; 68 designates a low frequency delay circuit for delaying the output of the frequency converter 67; and 69 designates a low frequency vector regulator for adjusting the pass amplitude and pass phase of the output of the delay circuit 68.

The present embodiment 6 of the feedforward amplifier differs from the foregoing embodiment 5 in that the part of the input signal divided by the input side splitter 25 is immediately down-converted to the low frequency by the frequency converter 67. The output of the frequency converter 67 passes through the low frequency delay circuit 68 and the low frequency vector regulator 69, and is supplied to the combiner 66. The subsequent operation is the same as that of the foregoing embodiment 5.

As described above, the present embodiment 6 can achieve the same advantages as the foregoing embodiment 5. In addition, the present embodiment 6 can utilize low frequency components for the delay circuit 68 and the vector regulator 69, which are fabricated easier than those of the radio-frequency counterparts. In addition, the vector regulator can be configured using a signal processing circuit (DSP: Digital Signal Processor) which can provide greater flexibility to the vector regulator, making it easier to miniaturize and adjust the vector regulator, and by extension to reduce the size of the feedforward amplifier and to improve the distortion characteristic.

Furthermore, since all the circuit components following the frequency converters 64 and 67 are low frequency components, it possible to integrate them into an IC including the controller 56 for controlling the distortion canceling loop 102 (that is, the second vector regulator 11) of the feedforward distortion compensation circuit. Thus, the present embodiment 6 offers an advantage of being able to implement the feedforward amplifier with a reduced size and cost.

Embodiment 7

Figure 11:
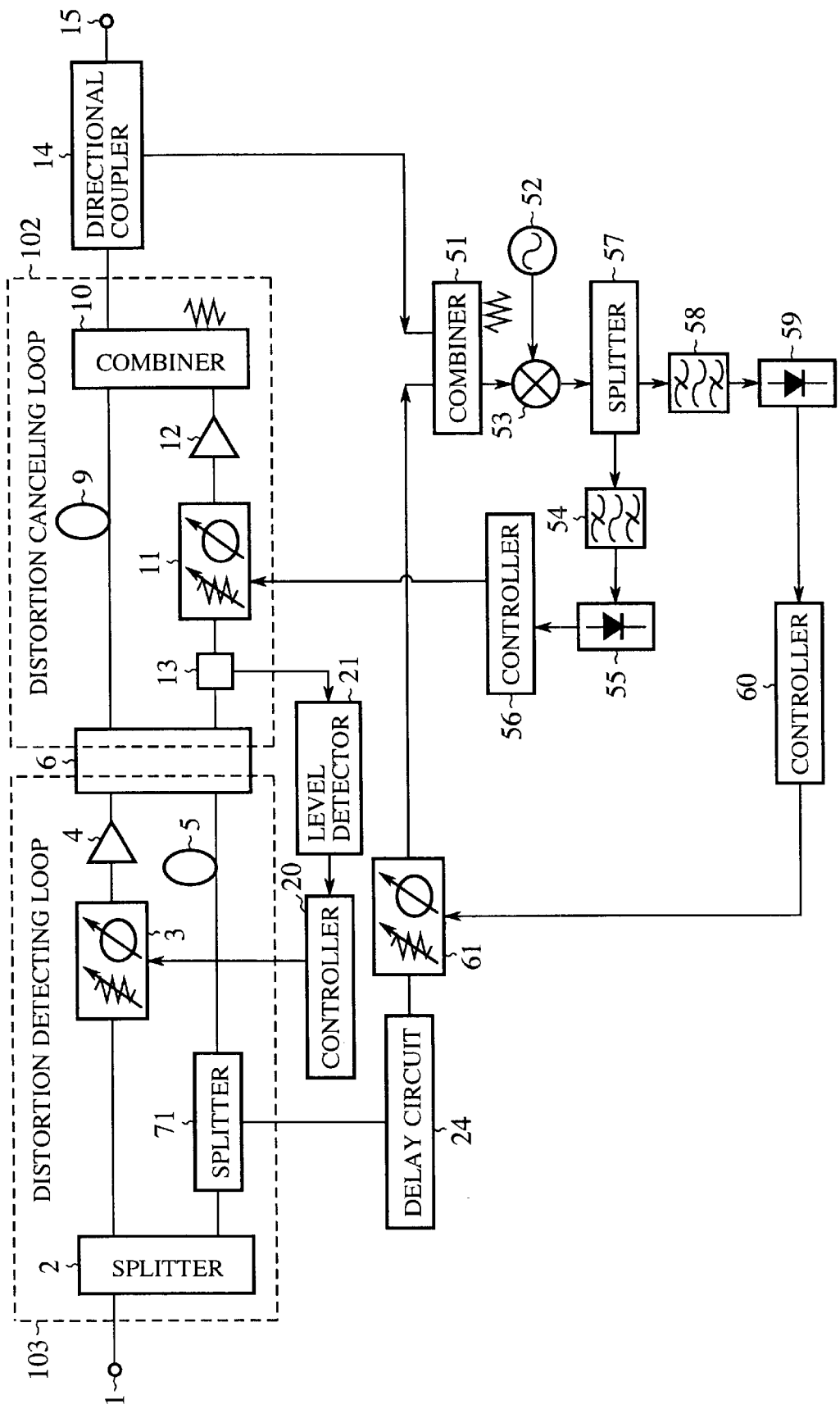
FIG. 11 is a block diagram showing a configuration of an embodiment 7 of the feedforward amplifier in accordance with the present invention.

FIG. 11 is a block diagram showing a configuration of the present embodiment 7 of the feedforward amplifier. In FIG. 11, the same or like portions to those of FIG. 6 are designated by the same reference numerals, and the description thereof is omitted here. In FIG. 11, the reference numeral 71 designates a splitter (first splitter) interposed between the splitter 2 and the delay circuit 5 for further dividing the part of the input signal divided by the splitter 2.

The present embodiment 7 of the feedforward amplifier differs from the foregoing embodiment 2 in that it comprises the splitter 71, which is interposed between the splitter 2 and the delay circuit 5 for further dividing the part of the input signal divided by the splitter 2, instead of the splitter 25 for dividing the input signal supplied from the input terminal 1.

The foregoing configuration can remove the splitter 25 from the main path of the input signal from the input terminal 1 to the splitter/combiner 6 via the main amplifier 4, that is, the path of the major part of the signal to become the output signal of the feedforward amplifier, thereby preventing the reduction in the total gain of the amplifier due to the loss of the splitter 25.

Although the configuration of FIG. 11 changes the position of the splitter 25 for dividing the input signal in the foregoing embodiment 2, the foregoing embodiments 1, and 3–6 can also offer the same advantage as the present embodiment 7 by changing the position of their splitter 25.
Embodiment 8

Figure 12:
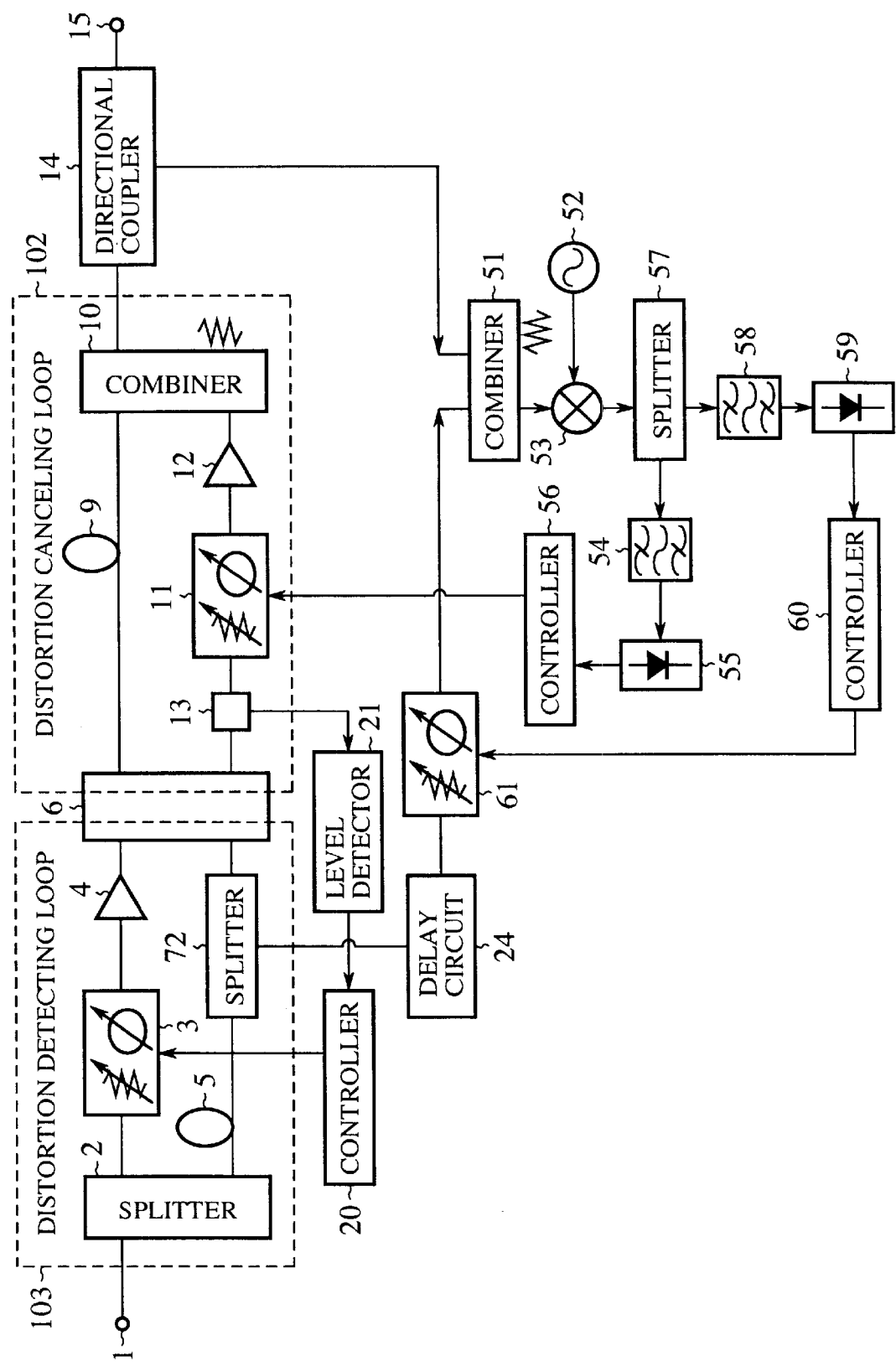
FIG. 12 is a block diagram showing a configuration of an embodiment 8 of the feedforward amplifier in accordance with the present invention.

FIG. 12 is a block diagram showing a configuration of the present embodiment 8 of the feedforward amplifier. In FIG. 12, the same or like portions to those of FIG. 6 are designated by the same reference numerals, and the description thereof is omitted here. In FIG. 12, the reference numeral 72 designates a splitter interposed into the path on the output side of the delay circuit 5 for further dividing a part of the input signal divided by the splitter 2 and passing through the delay circuit 5.

The present embodiment 8 of the feedforward amplifier differs from the foregoing embodiment 2 in that it comprises the splitter 72, which is interposed into the path on the-output side of the delay circuit 5 for further dividing the part of the input signal divided by the splitter 2 and passing through the delay circuit 5, instead of the splitter 25 for dividing the input signal supplied from the input terminal 1.

This configuration makes it possible for the delay circuit 5 to share the function of the delay circuit 24 in part, reducing the delay time of the delay circuit 24. Thus, it is possible to reduce the size of the delay circuit 24, and by extension to reduce the size of the device.

Although the configuration of FIG. 12 utilizes the splitter 72 interposed into the path on the output side of the delay circuit 5 in place of the splitter 25 for dividing the input signal in the foregoing embodiment 2, the foregoing embodiments 1, and 3–6 can also offer the same advantage as the present embodiment 8 by changing the position of their splitter 25 to the output side of the delay circuit 5.

INDUSTRIAL APPLICABILITY

As described above, the feedforward amplifier in accordance with the present invention can be preferably applied to the low distortion amplification in a radio frequency band such as VHF, UHF and microwave frequency bands for implementing favorable distortion compensation without being affected by the ambient temperature or deterioration with age.

What is claimed is:

1. A feedforward amplifier that includes a distortion detecting loop having a first vector regulator, and a distortion canceling loop having a second vector regulator, and that carries out feedforward distortion compensation, said feedforward amplifier comprising:

a directional coupler for extracting a part of an output signal;

a first splitter for extracting a part of an input signal;

a delay circuit for delaying the input signal extracted by said first splitter;

a combiner for combining the input signal delayed by said delay circuit with the output signal extracted by said directional coupler;

a local oscillator for generating a signal of a prescribed frequency;

a frequency converter for down-converting an output of said combiner to a low frequency using the signal generated by said local oscillator;

a first filter for passing a distortion component and for rejecting a signal component of an output of said frequency converter;

a distortion component detector for measuring the distortion component output from said first filter; and a second vector regulator controller for controlling said second vector regulator of said distortion canceling loop such that the distortion component measured by said distortion component detector becomes minimum.

2. The feedforward amplifier according to claim 1, further comprising:

a third vector regulator interposed between said delay circuit and said combiner for changing pass amplitude and pass phase of an output of said delay circuit;

a second splitter interposed between said combiner and said first filter for dividing a signal supplied to it;

a second filter for passing a signal component and for rejecting a distortion component of a signal delivered by said second splitter;

a signal component detector for measuring the signal component output from said second filter; and a third vector regulator controller for controlling said third vector regulator such that the signal component measured by said signal component detector becomes minimum.

3. The feedforward amplifier according to claim 1, further comprising:

a third vector regulator interposed between said delay circuit and said combiner for changing pass amplitude and pass phase of an output of said delay circuit;

a second splitter interposed between said combiner and said first filter for dividing a signal supplied to it;

a signal component detector for measuring a signal component delivered by said second splitter; and a third vector regulator controller for controlling said third vector regulator such that the signal component measured by said signal component detector becomes minimum.

4. The feedforward amplifier according to claim 3, wherein said second splitter is interposed between said combiner and said frequency converter.

5. The feedforward amplifier according to claim 1, wherein said distortion detecting loop comprises an input side splitter for dividing the input signal, and a main amplifier for amplifying a first part of the input signal divided by said input side splitter, and wherein said first splitter further divides a second part of the input signal divided by said input side splitter.

6. The feedforward amplifier according to claim 1, wherein said distortion detecting loop comprises an input side splitter for dividing the input signal, a main amplifier for amplifying a first part of the input signal divided by said input side splitter, and an intra-distortion-detecting-loop delay circuit for delaying a second part of the input signal divided by said input side splitter, and wherein said first splitter is interposed into a path on an output side of said intra-distortion-detecting-loop delay circuit.

7. A feedforward amplifier that includes a distortion detecting loop having a first vector regulator, and a distortion canceling loop having a second vector regulator, and that carries out feedforward distortion compensation, said feedforward amplifier comprising:

a first splitter for extracting a part of an input signal;

a delay circuit for delaying the input signal extracted by said first splitter;

a third vector regulator for changing pass amplitude and pass phase of an output of said delay circuit;

a local oscillator for generating a signal of a prescribed frequency;

a first frequency converter for down-converting an output of said third vector regulator to a low frequency using the signal generated by said local oscillator;

a directional coupler for extracting a part of an output signal;

a second frequency converter for down-converting an output of said directional coupler to a low frequency using the signal generated by said local oscillator;

a combiner for combining an output of said first frequency converter and an output of said second frequency converter;

a second splitter for dividing an output of said combiner;

a first filter for passing a distortion component and for rejecting a signal component of a first output of said second splitter;

a distortion component detector for measuring the distortion component output from said first filter;

a second vector regulator controller for controlling said second vector regulator of said distortion canceling loop such that the distortion component measured by said distortion component detector becomes minimum;

a second filter for passing a signal component and for rejecting a distortion component of a second output of said second splitter;

a signal component detector for measuring the signal component output from said second filter; and a third vector regulator controller for controlling said third vector regulator such that the signal component measured by said signal component detector becomes minimum.

8. A feedforward amplifier that includes a distortion detecting loop having a first vector regulator, and a distortion canceling loop having a second vector regulator, and that carries out feedforward distortion compensation, said feedforward amplifier comprising:

a first splitter for extracting a part of an input signal;

a local oscillator for generating a signal of a prescribed frequency;

a first frequency converter for down-converting the input signal extracted by said first splitter to a low frequency using the signal generated by said local oscillator;

a delay circuit for delaying an output signal of said first frequency converter;

a third vector regulator for changing pass amplitude and pass phase of an output of said delay circuit;

a directional coupler for extracting a part of an output signal;

a second frequency converter for down-converting an output of said directional coupler to a low frequency using the signal generated by said local oscillator;

a combiner for combining an output of said second frequency converter and a signal passing through said third vector regulator;

a second splitter for dividing an output of said combiner;

a first filter for passing a distortion component and for rejecting a signal component of a first output of said second splitter;

a distortion component detector for measuring the distortion component output from said first filter;

a second vector regulator controller for controlling said second vector regulator of said distortion canceling loop such that the distortion component measured by said distortion component detector becomes minimum;

a second filter for passing a signal component and for rejecting a distortion component of a second output of said second splitter;

a signal component detector for measuring the signal component output from said second filter; and a third vector regulator controller for controlling said third vector regulator such that the signal component measured by said signal component detector becomes minimum.

* * * * *